United States Patent
Wang et al.

(10) Patent No.: US 8,421,506 B2
(45) Date of Patent: Apr. 16, 2013

(54) OUTPUT BUFFER WITH PROCESS AND TEMPERATURE COMPENSATION

(75) Inventors: Chua-Chin Wang, Kaohsiung (TW); Ron-Chi Kuo, Kaohsiung (TW); Jen-Wei Liu, Kaohsiung (TW); Ming-Dou Ker, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 301 days.

(21) Appl. No.: 12/845,231

(22) Filed: Jul. 28, 2010

(65) Prior Publication Data

US 2011/0291742 A1 Dec. 1, 2011

(30) Foreign Application Priority Data

May 27, 2010 (TW) .............................. 99117091 A

(51) Int. Cl.
*H03K 3/00* (2006.01)
(52) U.S. Cl.
USPC ............................................................ 327/108
(58) Field of Classification Search ................. None
See application file for complete search history.

(56) References Cited

U.S. PATENT DOCUMENTS

| | | | | |
|---|---|---|---|---|
| 5,748,014 A * | 5/1998 | Bayer | ............................. | 327/72 |
| 6,114,885 A * | 9/2000 | Yang et al. | .................... | 327/112 |
| 6,538,464 B2 | 3/2003 | Muljono et al. | | |
| 6,657,504 B1 * | 12/2003 | Deal et al. | ........................ | 331/57 |
| 7,057,415 B2 * | 6/2006 | Allen et al. | ...................... | 326/82 |
| 7,202,702 B2 * | 4/2007 | Arnold et al. | ................... | 326/87 |
| 7,221,193 B1 * | 5/2007 | Wang et al. | ................... | 327/108 |
| 7,598,772 B2 * | 10/2009 | Young | ............................. | 326/83 |

* cited by examiner

*Primary Examiner* — Lincoln Donovan
*Assistant Examiner* — Khareem E Almo
(74) *Attorney, Agent, or Firm* — Muncy, Geissler, Olds & Lowe, PLLC

(57) ABSTRACT

An output buffer with process and temperature compensation comprises an enable terminal, a clock generator, a PMOS threshold voltage detector, an NMOS threshold voltage detector, a first comparator, a second comparator, a first compensation code generator, a second compensation code generator and an output buffer stage, wherein the output buffer stage has an output stage, the output buffer stage means for controlling a drive current generated by the output stage, wherein the output stage has a first voltage output terminal, and the modulated drive current is capable of compensating slew rate of the first voltage output terminal.

19 Claims, 12 Drawing Sheets

OUTPUT BUFFER WITH PROCESS AND TEMPERATURE COMPENSATION

FIELD OF THE INVENTION

The present invention is generally relating to an output buffer, more particularly to an output buffer with process and temperature compensation.

BACKGROUND OF THE INVENTION

A conventional output buffer with process and temperature compensation, with reference to U.S. Pat. No. 6,538,464 and FIG. 12, the output buffer 50 comprises a temperature detector 51, a voltage detector 52, a compensation circuit 53, a drive circuit 54 and a pre-driver circuit 55. The temperature detector 51 means for detecting temperature from the output buffer 50, the voltage detector 52 means for detecting supply voltage from the output buffer 50, the compensation circuit 53 is capable of generating an impedance control signal to control an impedance compensation circuit 541 of the drive circuit 54. The impedance compensation circuit 541 means for modulating temperature and supply voltage of the output buffer 50. The pre-driver circuit 55 means for controlling slew rate of the drive circuit 54 in response to temperature and supply voltage of the output buffer 50. However, the conventional output buffer 50 merely obtains slew rate information from effects in response to temperature and supply voltage and unable to obtain slew rate information from effects of PMOS transistors and NMOS transistors under various temperature and process conditions.

SUMMARY

A primary object of the present invention is to provide an output buffer with process and temperature compensation comprises an enable terminal, a clock generator, a PMOS threshold voltage detector, an NMOS threshold voltage detector, a first comparator, a second comparator, a first compensation code generator, a second compensation code generator and an output buffer stage, the enable terminal is applied to provide an enable signal, the clock generator is electrically connected to the enable terminal and applied to receive the enable signal to provide at least one clock signal, the PMOS threshold voltage detector is electrically connected to the clock generator and applied to receive the clock signal to provide a first analog signal, the NMOS threshold voltage detector is electrically connected to the clock generator and applied to receive the clock signal to provide a second analog signal, the first comparator is electrically connected to the PMOS threshold voltage detector and applied to receive the first analog signal to provide a first trigger signal, the second comparator is electrically connected to the NMOS threshold voltage detector and applied to receive the second analog signal to provide a second trigger signal, the first compensation code generator is electrically connected to the first comparator and the clock generator and applied to receive the clock signal and the first trigger signal to provide a first compensation code, the second compensation code generator is electrically connected to the second comparator and the clock generator and applied to receive the clock signal and the second trigger signal to provide a second compensation code, the output buffer stage is electrically connected to the first compensation code generator and the second compensation code generator, the output buffer stage has an output stage, the output buffer stage is applied to receive the first compensation code and the second compensation code to control a drive current generated by the output stage, wherein the output stage has a first voltage output terminal, and the modulated drive current is capable of compensating slew rate of the first voltage output terminal. This invention is able to detect variance of threshold voltage of PMOS transistors and NMOS transistors in various process and temperature conditions via the PMOS threshold voltage detector and the NMOS threshold voltage detector. Besides, the output buffer stage modulates the drive current therefore effectively compensating slew rate of the first voltage output terminal.

DETAILED DESCRIPTION OF THE INVENTION

Figure 1:
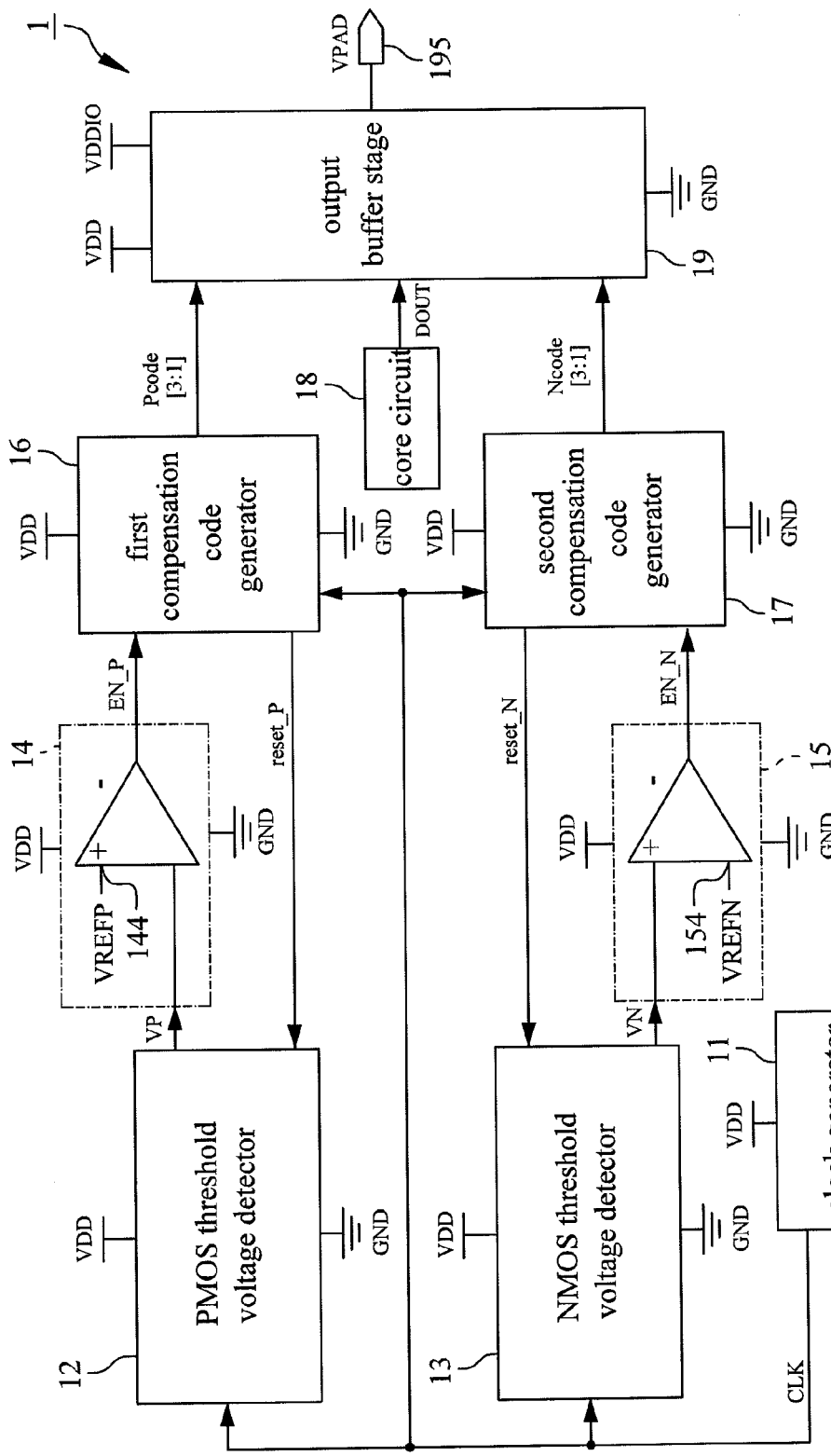
FIG. 1 is a block diagram illustrating an output buffer with process and temperature compensation in accordance with an embodiment of the present invention.
Figure 9:
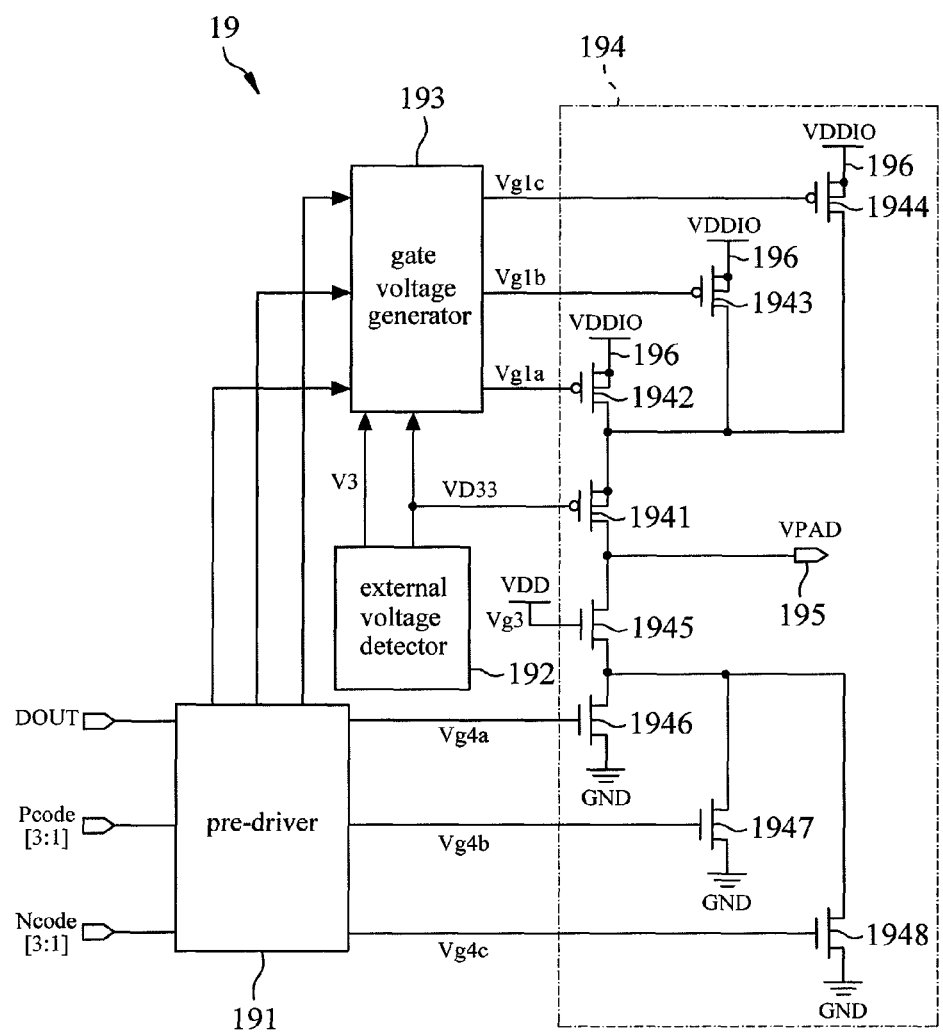
FIG. 9 is a circuit of output buffer stage illustrating the output buffer with process and temperature compensation in accordance with the embodiment of the present invention.

Referring to FIG. 1, an output buffer with process and temperature compensation 1 in accordance with an embodiment of this invention at least comprises an enable terminal 10, a clock generator 11, a PMOS threshold voltage detector 12, an NMOS threshold voltage detector 13, a first comparator 14, a second comparator 15, a first compensation code generator 16, a second compensation code generator 17 and an output buffer stage 19, the enable terminal 10 is applied to send an enable signal, the clock generator 11 is electrically connected to the enable terminal 10 and applied to receive an enable signal to provide at least one clock signal, the PMOS threshold voltage detector 12 is electrically connected to the clock generator 11 and applied to receive the clock signal to provide a first analog signal, the NMOS threshold voltage detector 13 is electrically connected to the clock generator 11 and applied to receive the clock signal to provide a second analog signal, the first comparator 14 is electrically connected to the PMOS threshold voltage detector 12 and applied to receive the first analog signal to provide a first trigger signal, the second comparator 15 is electrically connected to the NMOS threshold voltage detector 13 and applied to receive the second analog signal to provide a second trigger signal, the first compensation code generator 16 is electrically connected to the first comparator 14 and the clock generator 11 and applied to receive the clock signal and the first trigger signal to provide a first compensation code, the second compensation code generator 17 is electrically connected to the second comparator 15 and the clock generator 11 and applied to receive the clock signal and the second trigger signal to provide a second compensation code, with reference to FIG. 1 and FIG. 9, the output buffer stage 19 is electrically connected to the first compensation code generator 16 and the second compensation code generator 17, the output buffer stage 19 has an output stage 194, the output buffer stage 19 is applied to receive the first compensation code and the second compensation code to control a drive current generated by the output stage 194, wherein the output stage 194 has a first voltage output terminal 195, and the modulated drive current is capable of compensating slew rate of the first voltage output terminal 195. In this embodiment, the output buffer with process and temperature compensation 1 further comprises a core circuit 18 that is electrically connected to the output buffer stage 19 and applied to transfer a signal.

Figure 3:
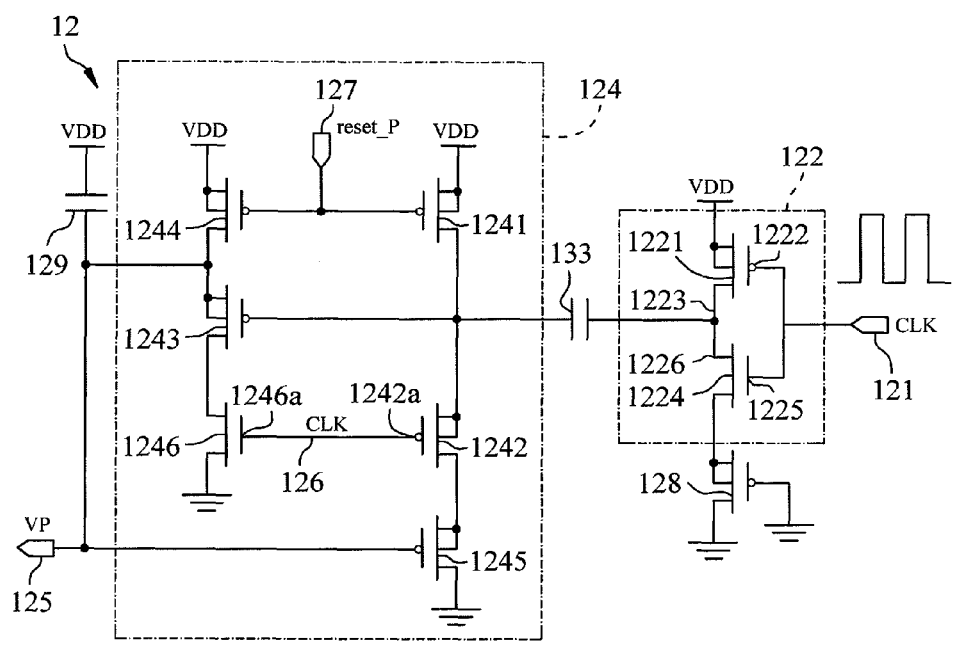
FIG. 3 is a circuit of PMOS threshold voltage detector illustrating the output buffer with process and temperature compensation in accordance with the embodiment of the present invention.

Referring to FIG. 3, in this embodiment, the PMOS threshold voltage detector 12 at least comprises a first clock terminal 121, a first CMOS inverter 122, a first capacitor 123, a PMOS threshold voltage function generator 124 and a second voltage output terminal 125, wherein the first clock terminal 121 means for receiving the clock signal from the clock generator 11, the first CMOS inverter 122 is electrically connected to the first clock terminal 121, the first capacitor 123 is electrically connected to the first CMOS inverter 122, in this embodiment, the first CMOS inverter 122 is composed of a first PMOS transistor 1221 and a first NMOS transistor 1224, the first PMOS transistor 1221 and the first NMOS transistor 1224 have a gate terminal 1222,1225 and a drain terminal 1223,1226 respectively, each of the gate terminals 1222,1225 is electrically connected to the first clock terminal 121, each of the drain terminals 1223,1226 is electrically connected to the first capacitor 123, the PMOS threshold voltage function generator 124 is electrically connected to the first capacitor 123 and applied to generate a formula of voltage signal as a function of threshold voltage, the second voltage output terminal 125 is electrically connected to the PMOS threshold voltage function generator 124. With reference to FIG. 3, the PMOS threshold voltage detector 12 further comprises a second clock signal 126, the PMOS threshold voltage function generator 124 is composed of a third PMOS transistor 1241, a fourth PMOS transistor 1242, a fifth PMOS transistor 1243, a sixth PMOS transistor 1244, a seventh PMOS transistor 1245 and a third NMOS transistor 1246, wherein the fourth PMOS transistor 1242, the fifth PMOS transistor 1243 and the sixth PMOS transistor 1244 are electrically connected to the third PMOS transistor 1241, the fifth PMOS transistor 1243 is electrically connected to the sixth PMOS transistor 1244, the seventh PMOS transistor 1245 is electrically connected to the fourth PMOS transistor 1242, the third NMOS transistor 1246 is electrically connected to the fourth PMOS transistor 1242 and the fifth PMOS transistor 1243, the second clock terminal 126 is electrically connected to the fourth PMOS transistor 1242 and the third NMOS transistor 1246. In this embodiment, the fourth PMOS transistor 1242 has a gate terminal 1242a, the third NMOS transistor 1246 has a gate terminal 1246a, the second clock terminal 126 is electrically connected to the gate terminal 1242a of the fourth PMOS transistor 1242 and the gate terminal 1246a of the third NMOS transistor 1246, besides, the PMOS threshold voltage function generator 124 further comprises a first reset terminal 127 that is electrically connected to the third PMOS transistor 1241 and the sixth PMOS 1244. In this embodiment, the PMOS threshold voltage detector 12 further comprises an eighth PMOS transistor 128 and a second capacitor 129, the eighth PMOS transistor 128 is electrically connected to the first CMOS inverter 122, the second capacitor 129 is electrically connected to the PMOS threshold voltage function generator 124 and the second voltage output terminal 125 and applied to ease the voltage drop effect of the second voltage output terminal 125 caused from parasitic capacitor of the fifth PMOS transistor 1243 while the fifth PMOS transistor 1243 is in conduction.

Figure 4:
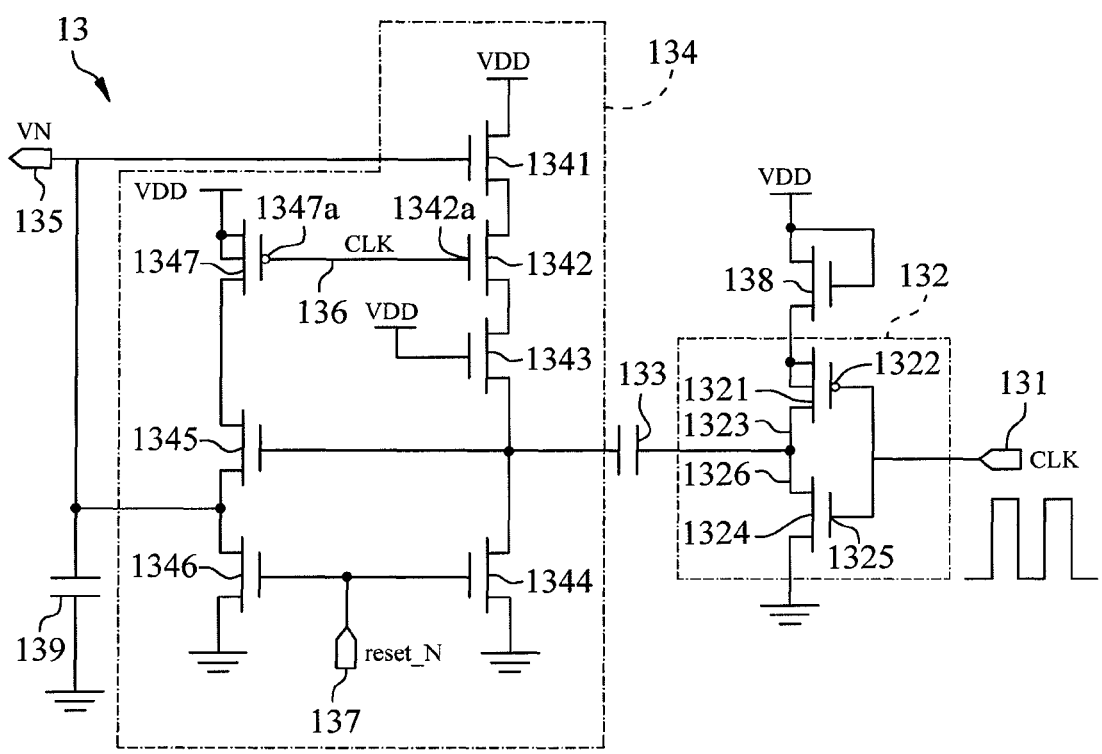
FIG. 4 is a circuit of NMOS threshold voltage detector illustrating the output buffer with process and temperature compensation in accordance with the embodiment of the present invention.

Referring to FIG. 4, in this embodiment, the NMOS threshold voltage detector 13 at least comprises a third clock terminal 131, a second CMOS inverter 132, a second capacitor 133, an NMOS threshold voltage function generator 134 and a third voltage output terminal 135, the third clock terminal 131 means for receiving the clock signal from the clock generator 11, the second CMOS inverter 132 is electrically connected to the third clock terminal 131, the second capacitor 133 is electrically connected to the second CMOS inverter 132, in this embodiment, the second CMOS inverter 132 is composed of a second PMOS transistor 1321 and a second NMOS transistor 1324, the second PMOS transistor 1321 and the second NMOS transistor 1224 have a gate terminal 1322, 1325 and a drain terminal 1323,1326 respectively, each of the gate terminals 1322,1325 is electrically connected to the third clock terminal 131, each of the drain terminals 1323,1326 is electrically connected to the second capacitor 133, the NMOS threshold voltage function generator 134 is electrically connected to the second capacitor 133 and applied to generate a formula of voltage signal as a function of threshold voltage, the third voltage output terminal 135 is electrically connected to the NMOS threshold voltage function generator 134. With reference to FIG. 4, the NMOS threshold voltage detector 13 further comprises a fourth clock signal 136, the NMOS threshold voltage function generator 134 is composed of a fourth NMOS transistor 1341, a fifth NMOS transistor 1342, a sixth NMOS transistor 1343, a seventh NMOS transistor 1344, an eighth NMOS transistor 1345, a ninth NMOS transistor 1346 and a ninth PMOS transistor 1347, wherein the fifth NMOS transistor 1342 is electrically connected to the fourth NMOS transistor 1341, the sixth NMOS transistor 1343 and the ninth PMOS transistor 1347 are electrically connected to the fifth NMOS transistor 1342, the seventh NMOS transistor 1344 and the eighth NMOS transistor 1345 are electrically connected to the sixth NMOS transistor 1343, the ninth NMOS transistor 1346 is electrically connected to the seventh NMOS transistor 1344 and the eighth NMOS transistor 1345, the eighth NMOS transistor 1345 is electrically connected to the ninth PMOS transistor 1347, the fourth clock terminal 136 is electrically connected to the fifth NMOS transistor 1342 and the ninth PMOS transistor 1347. In this embodiment, the fifth NMOS transistor 1342 has a gate terminal 1342a, the ninth PMOS transistor 1347 has a gate terminal 1347a, the fourth clock terminal 136 is electrically connected to the gate terminal 1342a of the fifth NMOS transistor 1342 and the gate terminal 1347a of the ninth PMOS transistor 1347, besides, the NMOS threshold voltage function generator 134 further comprises a second reset terminal 137 that is electrically connected to the seventh NMOS transistor 1344 and the ninth NMOS 1346. In this embodiment, the NMOS threshold voltage detector 13 further comprises a tenth NMOS transistor 138 and a fourth capacitor 139, the tenth PMOS transistor 138 is electrically connected to the second CMOS inverter 132, the fourth capacitor 139 is electrically connected to the NMOS threshold voltage function generator 134 and the third voltage output terminal 135 and applied to ease the voltage drop effect of the third voltage output terminal 135 caused from parasitic capacitor of the eighth NMOS transistor 1345 while the eighth NMOS transistor 1345 is in conduction.

Figure 2:
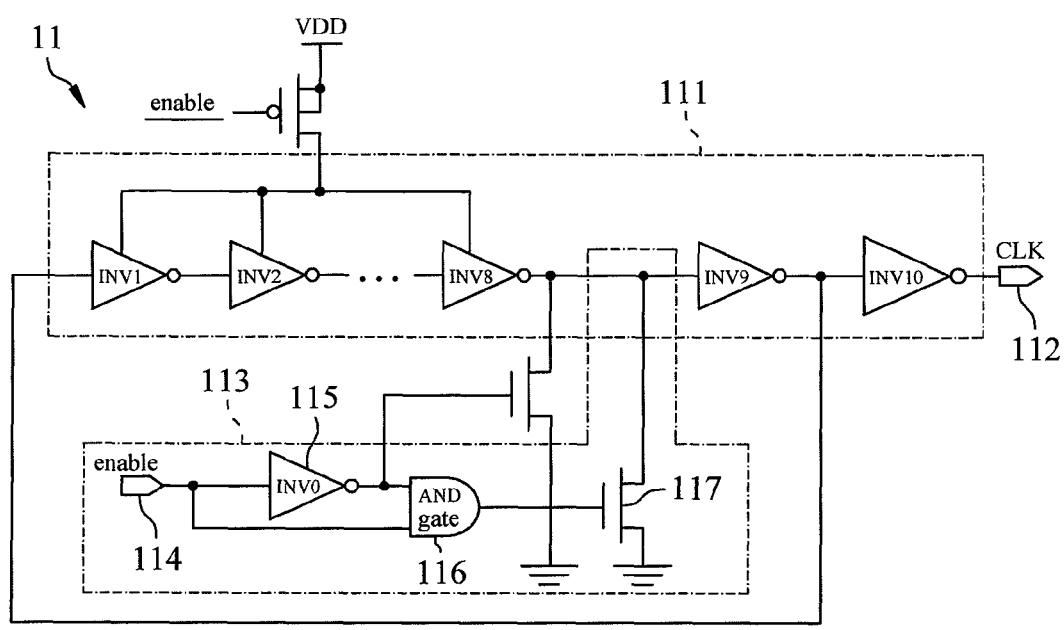
FIG. 2 is a circuit of clock generator illustrating the output buffer with process and temperature compensation in accordance with the embodiment of the present invention.
Figure 5:
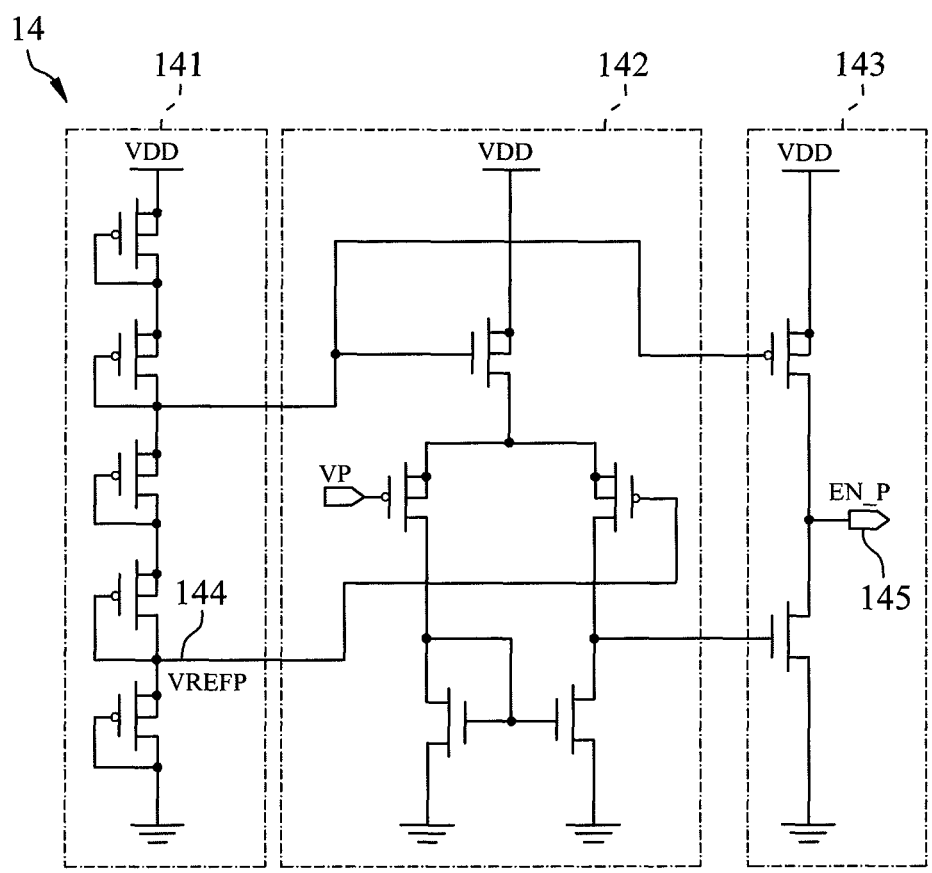
FIG. 5 is a circuit of first comparator illustrating the output buffer with process and temperature compensation in accordance with the embodiment of the present invention.
Figure 6:
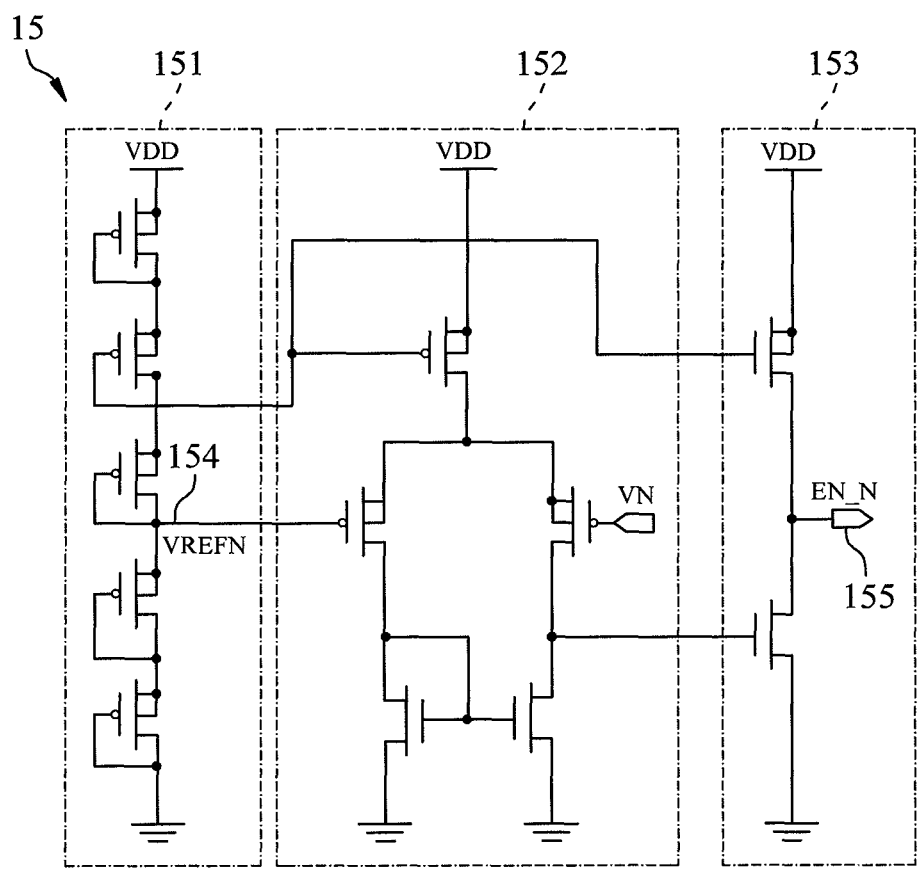
FIG. 6 is a circuit of second comparator illustrating the output buffer with process and temperature compensation in accordance with the embodiment of the present invention.
Figure 7:
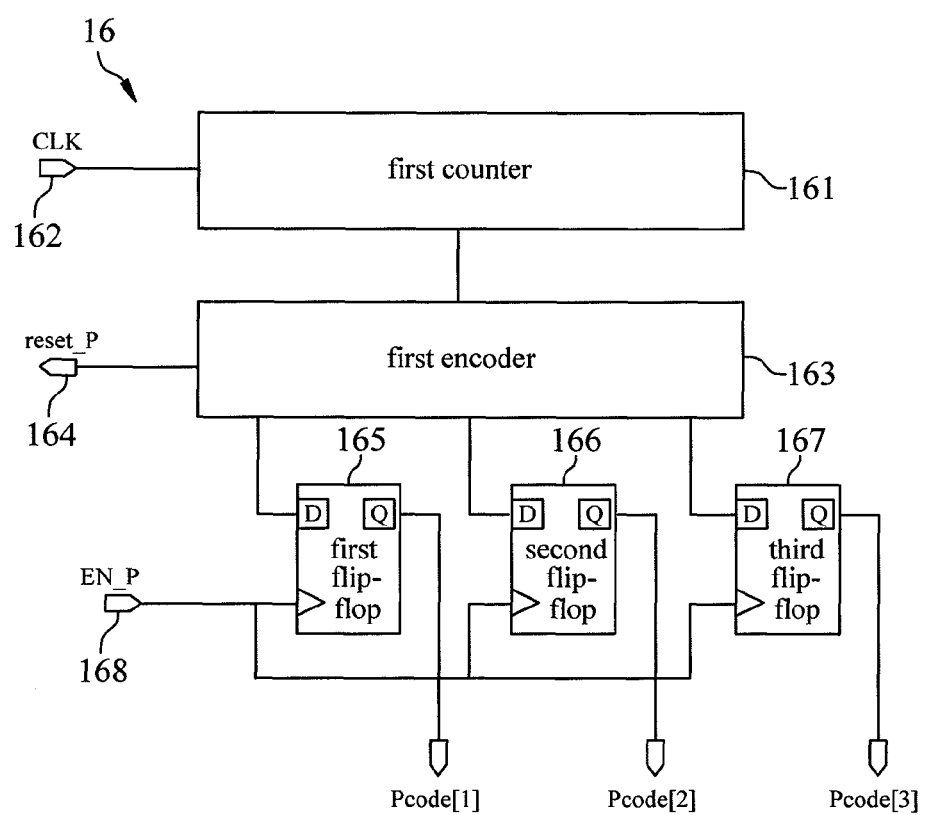
FIG. 7 is a circuit of first compensation code generator illustrating the output buffer with process and temperature compensation in accordance with the embodiment of the present invention.
Figure 8:
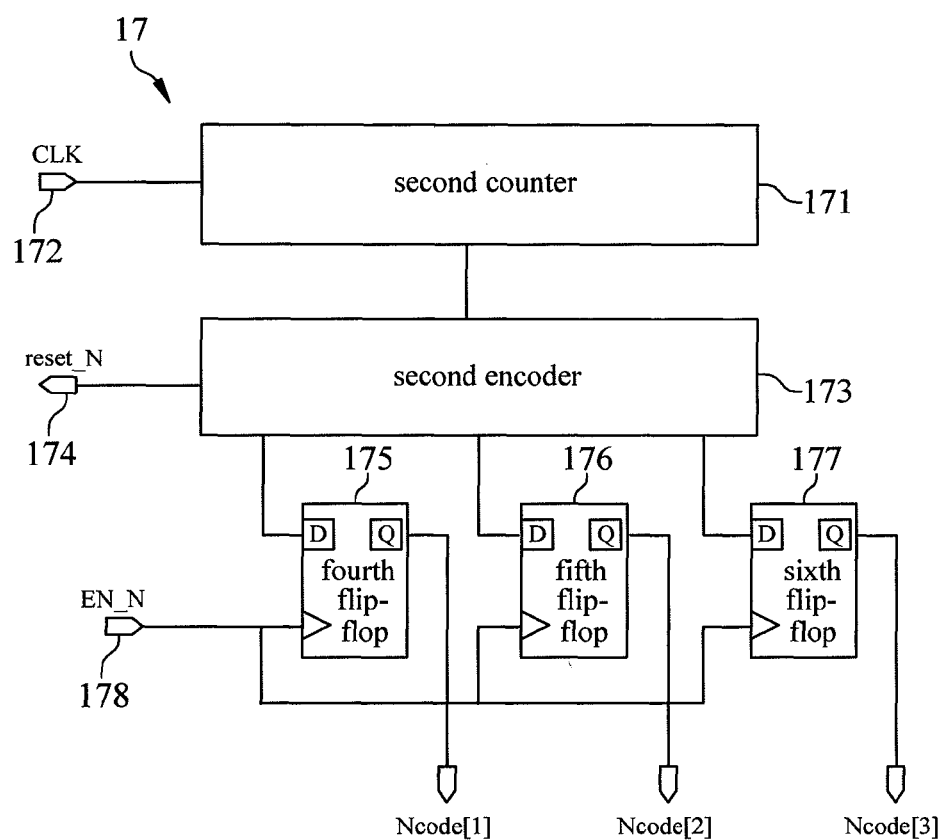
FIG. 8 is a circuit of second compensation code generator illustrating the output buffer with process and temperature compensation in accordance with the embodiment of the present invention.

Referring to FIG. 2, the clock generator 11 is composed of a ring oscillator 111 having a clock output terminal 112 and a start-up circuit 113, in this embodiment, the enable terminal 10 is electrically connected to the ring oscillator 111 and the start-up circuit 113, wherein the start-up circuit 113 is composed of an enable receiving terminal 114, an inverter 115, an AND gate 116 and an eleventh NMOS transistor 117, the AND gate 116 is electrically connected to the enable receiving terminal 114 and the inverter 115, the eleventh NMOS transistor 117 is electrically connected to the AND gate 116, and the ring oscillator 111 is electrically connected to the eleventh NMOS transistor 117, the start-up circuit 113 means for maintaining the ring oscillator 111 to operate normally. With reference to FIG. 5, the first comparator 14 is composed of a first bias-generating circuit 141 having a first reference terminal 144, a first current mirror 142 being electrically connected to the first bias-generating circuit 141 and a first output unit 143 being electrically connected to the first current mirror 142. The second voltage output terminal 125 is electrically connected to the first current mirror 142, the first reference terminal 144 is electrically connected to the first current mirror 142, and the first output unit 143 has a first trigger output terminal 145. With reference to FIG. 6, the second comparator 15 is composed of a second bias-generating circuit 151 having a second reference terminal 154, a second current mirror 152 being electrically connected to the second bias-generating circuit 151 and a second output unit 153 being electrically connected to the second current mirror 152. The third voltage output terminal 135 is electrically connected to the second current mirror 152, the second reference terminal 154 is electrically connected to the second current mirror 152, and the second output unit 153 has a second trigger output terminal 155. With reference to FIG. 7, the first compensation code generator 16 is composed of a first counter 161 having a fifth clock terminal 162, a first encoder 163 being electrically connected to the first counter 161, and a first flip-flop 165, a second flip-flop 166 and a third flip-flop 167 being electrically connected to the first encoder 163, wherein the first encoder 163 has a first reset output terminal 164. When the first flip-flop 165, the second flip-flop 166 and the third flip-flop 167 receive the first trigger signal, the first reset output terminal 164 is capable of sending a first reset signal to the PMOS threshold voltage detector 12 therefore enabling terminal voltage of the second voltage output terminal 125 to be discharged to zero volts. With reference to FIG. 8, the second compensation code generator 17 is composed of a second counter 171 having a sixth clock terminal 172, a second encoder 173 being electrically connected to the second counter 171, and a fourth flip-flop 175, a fifth flip-flop 176 and a sixth flip-flop 177 being electrically connected to the second encoder 173, wherein the second encoder 173 has a second reset output terminal 174. When the fourth flip-flop 175, the fifth flip-flop 176 and the sixth flip-flop 177 receive the second trigger signal, the second reset output terminal 174 is capable of sending a second reset signal to the NMOS threshold voltage detector 13 therefore enabling terminal voltage of the third voltage output terminal 135 to be discharged to zero volts.

Figure 10:
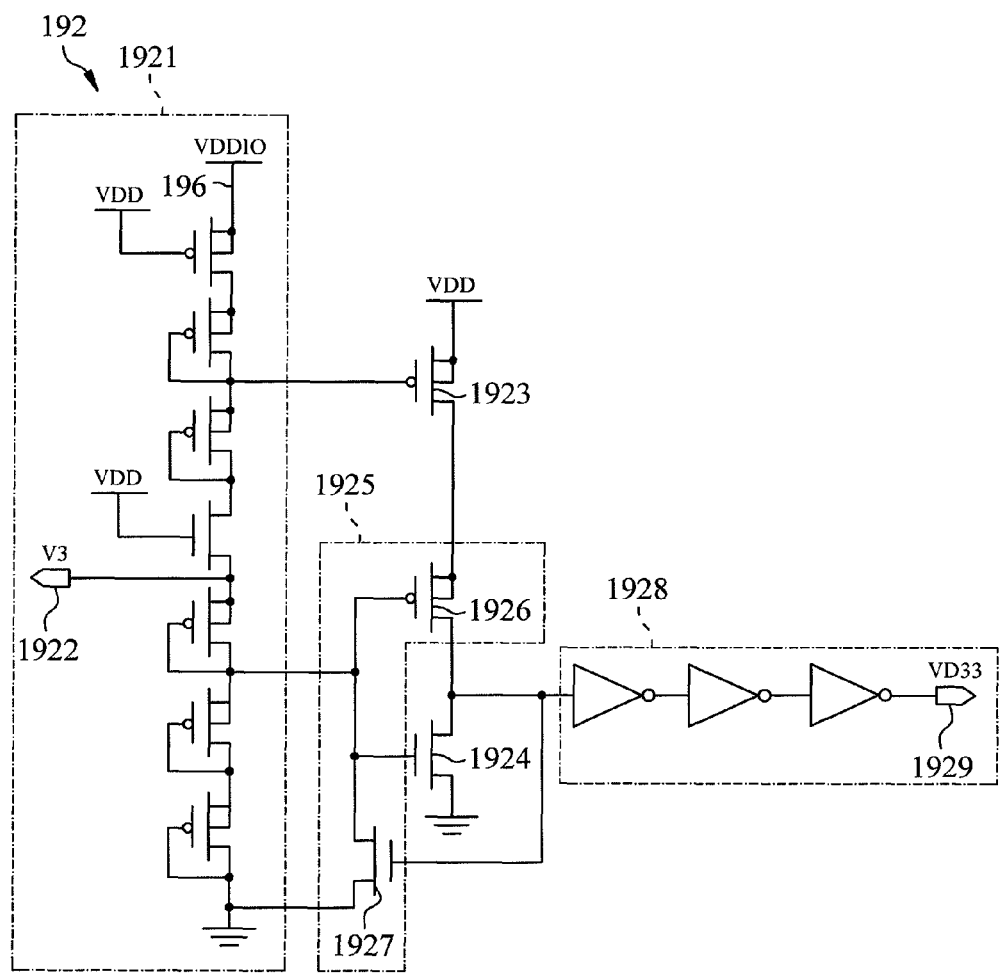
FIG. 10 is a circuit of external voltage detector of output buffer stage illustrating the output buffer with process and temperature compensation in accordance with the embodiment of the present invention.
Figure 11:
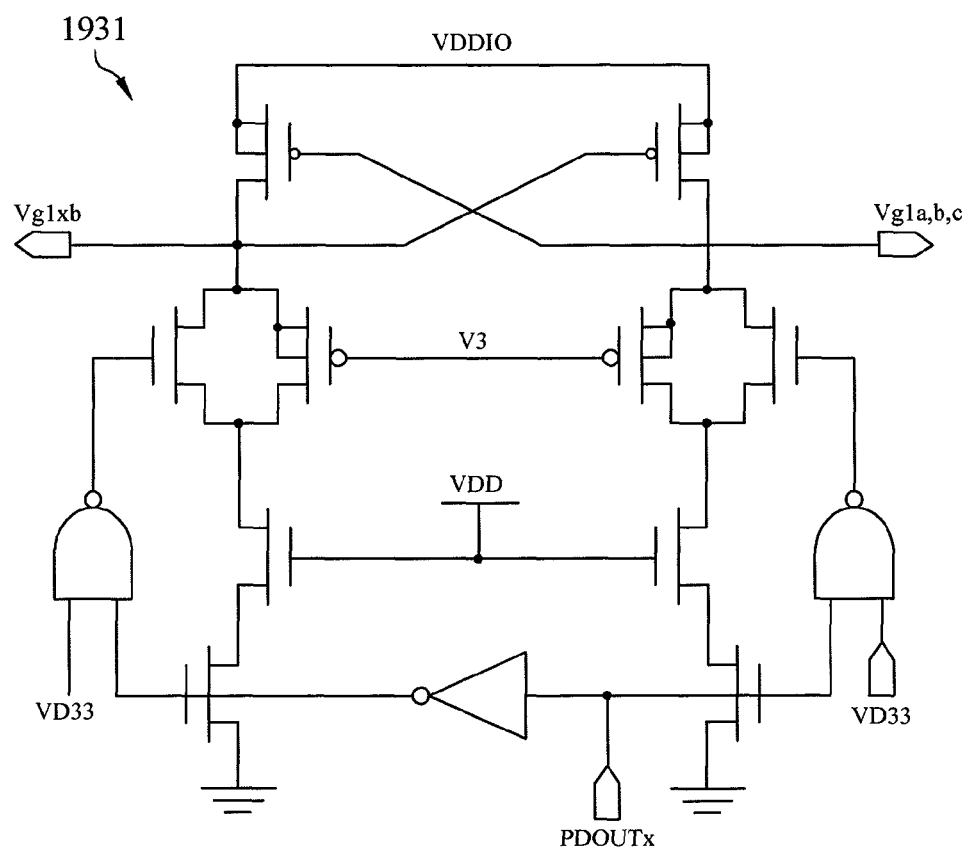
FIG. 11 is a circuit of voltage level converter of output buffer stage illustrating the output buffer with process and temperature compensation in accordance with the embodiment of the present invention.
Figure 12:
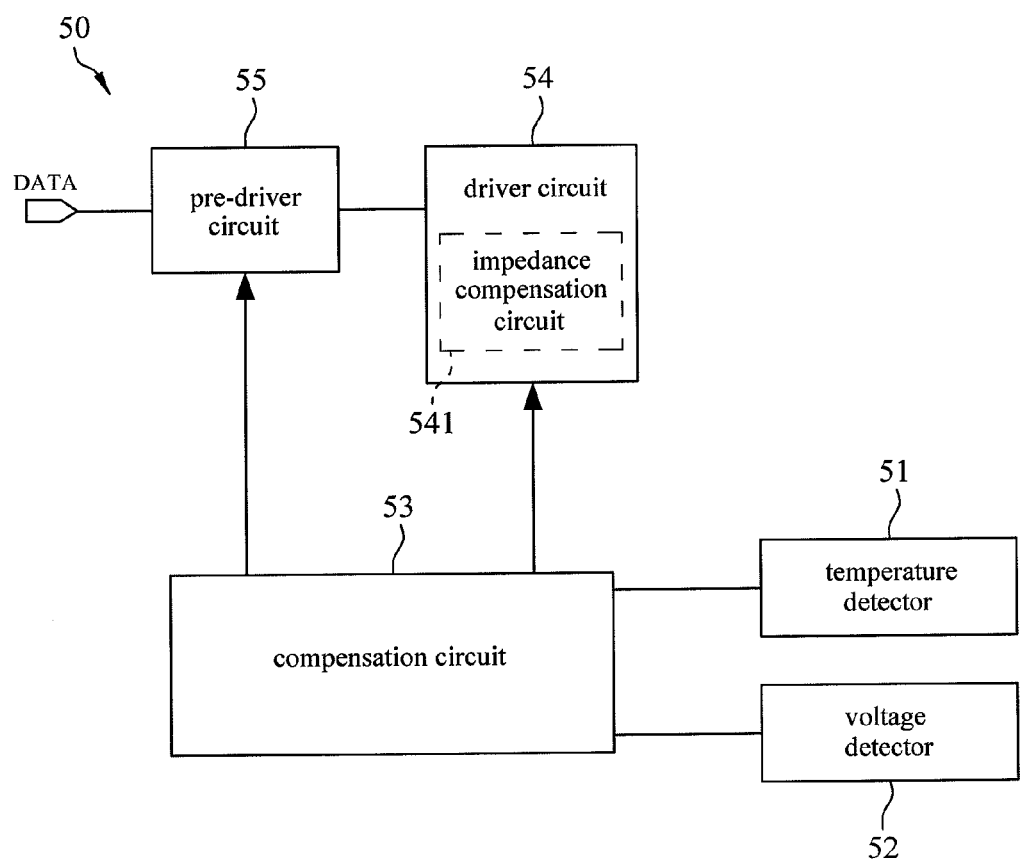
FIG. 12 is a block diagram of conventional output buffer with process and temperature compensation.

Referring to FIG. 9, the output buffer stage 19 further comprises a pre-driver 191, an external voltage detector 192 and a gate voltage generator 193. With reference to FIG. 11, the gate voltage generator 193 has at least one voltage level converter 1931 and electrically connects the pre-driver 191 and the external voltage detector 192, wherein the output stage 194 is electrically connected to the gate voltage generator 193, the external voltage detector 192 and the pre-driver 191. In this embodiment, the output stage 194 is electrically connected to the voltage level converter 1931 of the gate voltage generator 193. With reference to FIG. 10, the external voltage detector 192 is composed of a third bias-generating circuit 1921, a tenth PMOS transistor 1923, a twelfth NMOS transistor 1924, a protection circuit 1925 and a series-connected inverter 1928, wherein the tenth PMOS transistor 1923 is electrically connected to the third bias-generating circuit 1921, the protection circuit 1925 is electrically connected to the tenth PMOS transistor 1923 and the third bias-generating circuit 1921, the twelfth NMOS transistor 1924 is electrically connected to the protection circuit 1925, and the series-connected inverter 1928 is electrically connected to the protection circuit 1925 and the twelfth transistor 1924. In this embodiment, the protection circuit 1925 comprises an eleventh PMOS transistor 1926 and a thirteenth NMOS transistor 1927, the eleventh PMOS transistor 1926 is electrically connected to the tenth PMOS transistor 1923 and the third bias-generating circuit 1921, and the thirteen NMOS transistor 1927 is electrically connected to the twelfth NMOS transistor 1924. The eleventh PMOS transistor 1926 means for preventing effects from overstress of gate-oxide layer via excessive voltage across gate to source. The thirteenth NMOS transistor 1927 means for discharging one of the transistors of the third bias-generating circuit 1921 down to zero volts to shut down the twelfth NMOS transistor 1924 so that an unnecessary static leakage current can be avoided. With reference to FIG. 9 and FIG. 10, the third bias-generating circuit 1921 comprises a fourth voltage output terminal 1922, and the series-connected inverter 1928 comprises a fifth voltage output terminal 1929. The fourth voltage output terminal 1922 is electrically connected to the gate voltage generator 193, and the fifth voltage output terminal 1929 is electrically connected to the output stage 194 and the gate voltage generator 193. The output stage 194 further comprises a twelfth PMOS transistor 1941, a thirteenth PMOS transistor 1942, a fourteenth PMOS transistor 1943, a fifteenth PMOS transistor 1944, a fourteenth NMOS transistor 1945, a fifteenth NMOS transistor 1946, a sixteenth NMOS transistor 1947 and a seventeenth NMOS transistor 1948. In this embodiment, the output buffer stage 19 further comprises an external voltage receiving terminal 196 that is electrically connected to the output stage 194 and the external voltage detector 192, preferably, the thirteen PMOS transistor 1942, the fourteenth PMOS transistor 1943 and the fifteenth PMOS transistor 1944 are electrically connected to the external voltage receiving terminal 196. The external voltage receiving terminal 196 means for receiving a maximum of two times the supply voltage. The twelfth PMOS transistor 1941 is electrically connected to the thirteenth PMOS transistor 1942, the fourteenth transistor 1943 and the fifteenth transistor 1944, and the fifteenth NMOS transistor 1946, the sixteenth NMOS transistor 1947 and the seventeenth NMOS transistor 1948 are electrically connected to the fourteenth NMOS transistor 1945. The fourteenth NMOS transistor 1945 and the twelfth PMOS transistor 1941 are electrically connected to the first voltage output terminal 195.

Referring to FIG. 1, when the enable terminal 10 sends the enable signal, the clock output terminal 112 of the clock generator 11 is capable of providing the clock signal, and the PMOS threshold voltage detector 12 and the NMOS threshold voltage detector 13 receive the clock signal. With increase of the clock signal, the PMOS threshold voltage function generator 124 generates a formula that can be derived as $V_p = p \times q \times V_{thp} - m \times V_{DD}$, where $V_p$ is the voltage function and $V_p > 0$, q is the clock cycle, $V_{thp}$ is the threshold voltage of PMOS transistor, $V_{DD}$ is the supply voltage, p is a positive integer and m is a positive integer smaller than q. In this embodiment, the voltage function is the first analog signal. Similarly, with increase of the clock signal, the NMOS threshold voltage function generator 134 generates a formula that can be derived as $V_n = (V_{DD} - k \times V_{thn}) \times n$, where $V_n$ is the voltage function and $V_n > 0$, n is the clock cycle, $V_{thn}$ is the threshold voltage of NMOS transistor, $V_{DD}$ is the supply voltage and k is a positive integer. In this embodiment, the voltage function is the second analog signal. The first analog signal provided from the PMOS threshold voltage function generator 124 can be sent by the second voltage output terminal 125 and the second analog signal provided from the NMOS threshold voltage function generator 134 can be sent by the third voltage output terminal 135 respectively. Various process and temperature conditions lead variance of threshold voltage of PMOS transistors and NMOS transistors. Therefore, the number of clock cycle changes in various process and temperature conditions to construct different voltage levels of mentioned analog signals. The PMOS threshold voltage detector 12 and the NMOS threshold voltage detector 13 enable to detect variance of threshold voltage of PMOS transistors and NMOS transistors. With reference to FIG. 1 and FIG. 5, the second voltage output terminal 125 enables to send the first analog signal to the first comparator 14. When voltage level of the first analog signal is lower than voltage of the first reference terminal 144, the first trigger output terminal 145 of the first comparator 144 sends the first trigger signal to the first compensation code generator 16. With reference to FIG. 1 and FIG. 6, the third voltage output terminal 135 enables to send the second analog signal to the second comparator 15. When voltage level of the second analog signal is higher than voltage of the second reference terminal 154, the second trigger output terminal 155 of the second comparator 15 sends the second trigger signal to the second compensation code generator 17. With reference to FIG. 1 and FIG. 7, when the clock generator 11 sends the clock signal, the first counter 161 of the first compensation code generator 16 receives the clock signal. Consequently, when the PMOS threshold voltage detector 12 receives the clock signal at a time, the first counter 161 synchronously counts at a time, and then the first encoder 163 receives counting numbers from the first counter 161 to execute encode. In this embodiment, the first flip-flop 165, the second flip-flop 166 and the third flip-flop 167 are electrically connected to a first trigger receiving terminal 168. When the first comparator 14 sends the first trigger signal to the first trigger receiving terminal 168, the first trigger signal activates the first flip-flop 165, the second flip-flop 166 and the third flip-flop 167 to obtain the first compensation code. With reference to FIG. 1 and FIG. 8, when the clock generator 11 sends the clock signal, the second counter 171 of the second compensation code generator 17 receives the clock signal. Consequently, when the NMOS threshold voltage detector 13 receives the clock signal at a time, the second counter 171 synchronously counts at a time, and then the second encoder 173 receives counting numbers from the second counter 171 to execute encode. In this embodiment, the fourth flip-flop 175, the fifth flip-flop 176 and the sixth flip-flop 177 are electrically connected to a second trigger receiving terminal 178. When the first comparator 15 sends the second trigger signal to the second trigger receiving terminal 178, the second trigger signal activates the fourth flip-flop 175, the fifth flip-flop 176 and the sixth flip-flop 177 to obtain the second compensation code. With reference to FIG. 9, the pre-driver 191 of the output buffer stage 19 receives the first compensation code and the second compensation code. The output buffer stage 19 is capable of providing a plurality of gate voltage signals to control on/off operations of the PMOS transistors and the NMOS transistors via the pre-driver 191, the external voltage detector 192 and the gate voltage generator 193. The mentioned on/off operations can modulate the drive current that is provided by the output stage 194 and effectively compensate slew rate of the first voltage output terminal 195. This invention is able to detect variance of threshold voltage of PMOS transistors and NMOS transistors in various process and temperature conditions via the PMOS threshold voltage detector 12 and the NMOS threshold voltage detector 13. Besides, the output buffer stage 19 modulates the drive current therefore effectively compensating slew rate of the first voltage output terminal 195.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. An output buffer with process and temperature compensation comprising:

an enable terminal means for sending an enable signal;

a clock generator electrically connected to the enable terminal and applied to receive the enable signal to provide at least one clock signal;

a PMOS threshold voltage detector, for detecting variance of threshold voltage of PMOS transistors, electrically connected to the clock generator and applied to receive the at least one clock signal to provide a first analog signal;

an NMOS threshold voltage detector, for detecting variance of threshold voltage of NMOS transistors, electrically connected to the clock generator and applied to receive the at least one clock signal to provide a second analog signal;

a first comparator electrically connected to the PMOS threshold voltage detector and applied to receive the first analog signal to provide a first trigger signal;

a second comparator electrically connected to the NMOS threshold voltage detector and applied to receive the second analog signal to provide a second trigger signal;

a first compensation code generator, for providing a first compensation code while receiving the clock signal and the first trigger signal, electrically connected to the first comparator and the clock generator;

a second compensation code generator, for providing a second compensation signal while receiving the clock signal and the second trigger signal, electrically connected to the second comparator and the clock generator; and an output buffer stage, the output buffer stage has an output stage, the output buffer stage is applied to receive the first compensation code and the second compensation code to control a drive current generated by the output stage, wherein the output stage has a first voltage output terminal, and the modulated drive current is capable of compensating slew rate of the first voltage output terminal.

2. The output buffer with process and temperature compensation in accordance with claim 1, wherein the first compensation code generator is electrically connected to the PMOS threshold voltage detector and applied to send a first reset signal to the PMOS threshold voltage detector.

3. The output buffer with process and temperature compensation in accordance with claim 1, wherein the second compensation code generator is electrically connected to the NMOS threshold voltage detector and applied to send a second reset signal to the NMOS threshold voltage detector.

4. The output buffer with process and temperature compensation in accordance with claim 1, wherein the clock generator comprises a ring oscillator and a start-up circuit, where the start-up circuit is composed of an enable receiving terminal, an inverter, an AND gate and an eleventh NMOS transistor, the AND gate is electrically connected to the enable receiving terminal and the inverter, the eleventh NMOS transistor is electrically connected to the AND gate, and the ring oscillator is electrically connected to the eleventh NMOS transistor.

5. The output buffer with process and temperature compensation in accordance with claim 1, wherein the output buffer stage is composed of a pre-driver, an external voltage detector and a gate voltage generator, the gate voltage generator has at least one voltage level converter, the voltage level converter is electrically connected to the pre-driver and the external voltage detector.

6. The output buffer with process and temperature compensation in accordance with claim 5, wherein the output stage is electrically connected to the gate voltage generator, the external voltage detector and the pre-driver.

7. The output buffer with process and temperature compensation in accordance with claim 5, wherein the external voltage detector is composed of a third bias-generating circuit, a tenth PMOS transistor, a twelfth NMOS transistor, a protection circuit and a series-connected inverter, where the tenth PMOS transistor is electrically connected to the third bias-generating circuit, the protection circuit is electrically connected to the tenth PMOS transistor and the third bias-generating circuit, the twelfth NMOS transistor is electrically connected to the protection circuit, the series-connected inverter is electrically connected to the protection circuit and the twelfth NMOS transistor.

8. The output buffer with process and temperature compensation in accordance with claim 7, wherein the protection circuit comprises an eleventh PMOS transistor and a thirteenth NMOS transistor, the eleventh PMOS transistor is electrically connected to the tenth PMOS transistor and the third bias-generating circuit, and the thirteen NMOS transistor is electrically connected to the twelfth NMOS transistor.

9. The output buffer with process and temperature compensation in accordance with claim 1 further comprises an external voltage receiving terminal, and the external voltage receiving terminal is electrically connected to the output stage.

10. A PMOS threshold voltage detector with process and temperature compensation comprising:
a first clock terminal, the first clock terminal means for receiving a clock signal;
a CMOS inverter, the CMOS inverter is electrically connected to the first clock terminal;
a capacitor, the capacitor is electrically connected to the CMOS inverter;
a PMOS threshold voltage function generator, the PMOS threshold voltage function generator is electrically connected to the capacitor and applied to generate a formula of voltage signal as a function of threshold voltage; and
a voltage output terminal, the voltage output terminal is electrically connected to the PMOS threshold voltage function generator.

11. The PMOS threshold voltage detector with process and temperature compensation in accordance with claim 10, wherein the CMOS inverter is composed of a first PMOS transistor and a first NMOS transistor, the first PMOS transistor and the first NMOS transistor have a gate terminal and a drain terminal respectively, each of the gate terminals is electrically connected to the first clock terminal, and each of the drain terminals is electrically connected to the capacitor.

12. The PMOS threshold voltage detector with process and temperature compensation in accordance with claim 10 further comprises a second clock terminal, where the PMOS threshold voltage function generator is composed of a third PMOS transistor, a fourth PMOS transistor, a fifth PMOS transistor, a sixth PMOS transistor, a seventh PMOS transistor and a third NMOS transistor, wherein the fourth PMOS transistor, the fifth PMOS transistor and the sixth PMOS transistor are electrically connected to the third PMOS transistor, the fifth PMOS transistor is electrically connected to the sixth PMOS transistor, the seventh PMOS transistor is electrically connected to the fourth PMOS transistor, the third NMOS transistor is electrically connected to the fourth PMOS transistor and the fifth PMOS transistor, the second clock terminal is electrically connected to the fourth PMOS transistor and the third NMOS transistor.

13. The PMOS threshold voltage detector with process and temperature compensation in accordance with claim 12, wherein the PMOS threshold voltage function generator further comprises a first reset terminal, the first reset terminal is electrically connected to the third PMOS transistor and the sixth PMOS transistor.

14. The PMOS threshold voltage detector with process and temperature compensation in accordance with claim 10, wherein the formula can be derived as can be derived as $V_p = p \times q \times V_{thp} - m \times V_{DD}$, where $V_p$ is the voltage function and $V_p > 0$, q is the clock cycle, $V_{thp}$ is the threshold voltage of PMOS transistor, $V_{DD}$ is the supply voltage, p is a positive integer and m is a positive integer smaller than q.

15. An NMOS threshold voltage detector with process and temperature compensation comprising:
a third clock terminal, the third clock terminal means for receiving a clock signal;
a CMOS inverter, the CMOS inverter is electrically connected to the third clock terminal;
a capacitor, the capacitor is electrically connected to the CMOS inverter;
an NMOS threshold voltage function generator, the NMOS threshold voltage function generator is electrically connected to the capacitor and applied to generate a formula of voltage signal as a function of threshold voltage; and
a voltage output terminal, the voltage output terminal is electrically connected to the NMOS threshold voltage function generator.

16. The NMOS threshold voltage detector with process and temperature compensation in accordance with claim 15, wherein the CMOS inverter is composed of a second PMOS transistor and a second NMOS transistor, the second PMOS transistor and the second NMOS transistor have a gate terminal and a drain terminal respectively, each of the gate terminals is electrically connected to the third clock terminal, and each of the drain terminals is electrically connected to the capacitor.

17. The NMOS threshold voltage detector with process and temperature compensation in accordance with claim 15 further comprises a fourth clock terminal, the NMOS threshold voltage function generator is composed of a fourth NMOS transistor, a fifth NMOS transistor, a sixth NMOS transistor, a seventh NMOS transistor, an eighth NMOS transistor a ninth NMOS transistor and a ninth PMOS transistor, wherein the fourth NMOS transistor is electrically connected to the fifth NMOS transistor, the sixth NMOS transistor and the ninth PMOS transistor are electrically connected to the fifth NMOS transistor, the seventh NMOS transistor and the eighth NMOS transistor are electrically connected to the sixth NMOS transistor, the ninth NMOS transistor is electrically connected to the seventh NMOS transistor and the eighth NMOS transistor, the eighth NMOS transistor is electrically connected to the ninth PMOS transistor, the fourth clock terminal is electrically connected to the fifth NMOS transistor and the ninth PMOS transistor.

18. The NMOS threshold voltage detector with process and temperature compensation in accordance with claim 17, wherein the NMOS threshold voltage function generator further comprises a second reset terminal, the second reset terminal is electrically connected to the seventh NMOS transistor and the ninth NMOS transistor.

19. The NMOS threshold voltage detector with process and temperature compensation in accordance with claim 15, wherein the formula can be derived as $V_n=(V_{DD}-k \times V_{thn}) \times n$, where $V_n$ is the voltage function and $V_n>0$, n is the clock cycle, $V_{thn}$ is the threshold voltage of NMOS transistor, $V_{DD}$ is the supply voltage and k is a positive integer.

* * * * *